(12) United States Patent
Kawashima et al.

(10) Patent No.: US 8,151,856 B2
(45) Date of Patent: Apr. 10, 2012

(54) SURFACE PROTECTION FILM PEELING METHOD AND SURFACE PROTECTION FILM PEELING DEVICE

(75) Inventors: Isamu Kawashima, Tokyo (JP); Hideshi Sato, Tokyo (JP); Hideo Kino, Tokyo (JP); Minoru Ametani, Tokyo (JP)

(73) Assignee: Tokyo Seimitsu Co., Ltd., Mitaka-shi (JP)

( * ) Notice: Subject to any disclaimer, the term of this patent is extended or adjusted under 35 U.S.C. 154(b) by 676 days.

(21) Appl. No.: 11/750,302

(22) Filed: May 17, 2007

(65) Prior Publication Data
US 2007/0269962 A1 Nov. 22, 2007

(30) Foreign Application Priority Data

May 19, 2006 (JP) ................................. 2006-140074

(51) Int. Cl.
*B32B 38/10* (2006.01)
(52) U.S. Cl. ........................ 156/764; 156/714
(58) Field of Classification Search .................. 156/714, 156/764, 766
See application file for complete search history.

(56) References Cited

U.S. PATENT DOCUMENTS

| | | | |
|---|---|---|---|
| 4,880,488 A | 11/1989 | Matsuo et al. | |
| 5,009,735 A | 4/1991 | Ametani et al. | |
| 5,254,201 A | 10/1993 | Konda et al. | |
| 5,891,298 A | 4/1999 | Kuroda et al. | |
| 7,455,095 B2 * | 11/2008 | Yamamoto | 156/537 |
| 2004/0194895 A1 * | 10/2004 | Steinberger | 156/574 |
| 2007/0169895 A1 | 7/2007 | Kobayashi et al. | |

FOREIGN PATENT DOCUMENTS

| | | |
|---|---|---|
| JP | 2001-319906 | 11/2001 |
| JP | 2003-22986 | 1/2003 |
| JP | 2003-59862 | 2/2003 |
| JP | 2005-197429 | 7/2005 |

(Continued)

OTHER PUBLICATIONS

English translation of JP 2001-319906 A.*

(Continued)

*Primary Examiner* — Philip Tucker
*Assistant Examiner* — Nickolas Harm
(74) *Attorney, Agent, or Firm* — Christie, Parker & Hale, LLP.

(57) ABSTRACT

A film peeling device for peeling a film (11) adhered to a front surface of a wafer (20), on the back surface of which a dicing tape (3) is adhered, the wafer is integrated with a mount frame (36) into one body, comprises: a movable table (31), which can be moved horizontally to support the wafer and the mount frame while the surface protection film is being directed upward; a covering means (80) for covering an adhesive face (3a) of the dicing tape, which is exposed between the mount frame and the wafer at one end (28) of the wafer; and a adhering means (46) for adhering a peeling tape (4) to the film at the end of the wafer. The film is peeled from the front surface of the wafer by moving the movable table from the other end (29) of the wafer to one end after the peeling tape has adhered. Due to the foregoing, while the peeling tape is being prevented from adhering to the dicing tape, the film can be peeled from the front surface of the wafer in a shorter period of time.

6 Claims, 12 Drawing Sheets

FOREIGN PATENT DOCUMENTS

| | | |
|---|---|---|
| KR | 10-2004-0026900 | 4/2004 |
| WO | WO 97/08745 | 3/1997 |
| WO | WO 2005/104201 A1 | 11/2005 |

OTHER PUBLICATIONS

Patent Abstracts of Japan and English machine translation of JP 2005-197429 listed above.

Korean Notice of Allowance dated Oct. 30, 2008, for corresponding Korean Patent application 49417/2007 with English translation noting listed references in this IDS.

Patent Abstracts of Japan, Publication No. 2003022986 A, Published on Jan. 24, 2003, in the name of Nakada.

Search Report dated Sep. 27, 2007, for corresponding European Patent Application No. 07108402.4.

Search Report dated Oct. 26, 2007, for corresponding Singapore Patent Application No. 200703587-6.

Patent Abstracts of Japan, Publication No. 2001-319906; Date of Publication: Nov. 16, 2001; in the name of Takahiro Ashida et al.

Patent Abstracts of Japan, Publication No. 2003-022986; Date of Publication: Jan. 24, 2003; in the name of Miki Nakada.

Office action dated Nov. 2, 2010 for corresponding Japanese Application No. 2006-140074 including translation, 5pp.

* cited by examiner

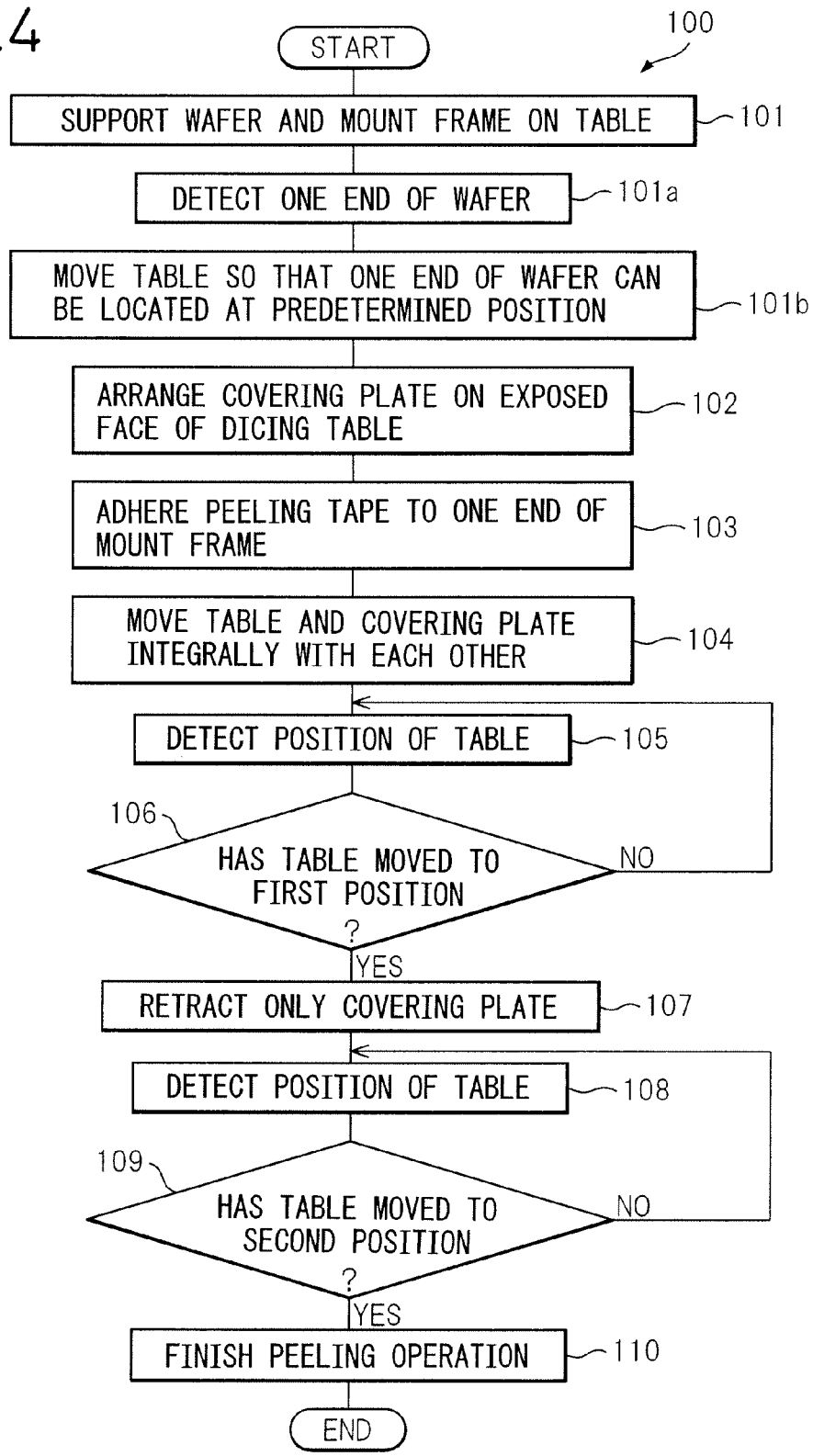

SURFACE PROTECTION FILM PEELING METHOD AND SURFACE PROTECTION FILM PEELING DEVICE

CROSS-REFERENCE TO RELATED APPLICATION

This application claims priority of Japanese Patent Application Number 2006-140074, filed on May 19, 2006.

BACKGROUND OF THE INVENTION

1. Field of the Invention

The present invention relates to a surface protection film peeling method for peeling a surface protection film adhered to the front surface of a wafer. The present invention also relates to a surface protection film peeling device for carrying out this surface protection film peeling method.

2. Description of the Related Art

In the field of manufacturing semiconductors, there is a tendency for large-sized wafers to be used year after year. Further, in order to enhance packing density, the wafer thickness is reduced. In order to reduce wafer thickness, usually, after a surface protection film for protecting a semiconductor element has been adhered to the front surface of a wafer, the back surface is ground.

After back-grinding is complete, as shown in FIG. 9, a dicing tape 3 is adhered to the back surface of the wafer 20, so that the wafer 20 and a ring type mount frame 36 can be integrated with each other into one body.

As shown in FIG. 10, the wafer 20 is supported on a table 131 so that a surface protection film 11 can be placed on the upper side. At this time, between the mount frame 36 and the wafer 20, an adhesive face 3a of the dicing tape 3 is annularly exposed. A peeling tape 4 is drawn out onto a adhering member 146, the cross-section of which is substantially triangular and the adhering member 146 is pressed onto the surface protection film 11, so that the peeling tape 4 can be adhered to the surface protection film 11. Then, the table 131 for supporting the wafer 20 is moved in a horizontal direction, a position, at which the peeling tape 4 is adhered, and functions as a peeling start position. Therefore, the surface protection film 11 can be continuously peeled from the wafer 20 from the peeling start position.

As shown in FIG. 10, a tip portion of the adhering member 146 is positioned obliquely downward with respect to the horizontal face and pressed onto the surface protection film 11. However, when the peeling tape 4 is drawn out, the peeling tape 4, which is located at the tip portion 146a of the adhering member 146, is loosened in such a manner that a loop 4' is formed by the loosened peeling tape 4. Accordingly, the peeling tape 4 comes into contact with an adhesive face 3a of the dicing tape 3. In this case, the thickness of the wafer 20 and the thickness of the surface protection film 11 are much smaller than the size of the adhering member 146.

Since the adhesive face of the peeling tape 4 is stuck onto the adhesive face of the dicing tape 3 in this case, when these tapes 3, 4 are adhered to each other, it is very difficult for an operator to separate them 3, 4 from each other without causing damage to the wafer 20. In this connection, even in the case where a cross-sectional shape of the adhering member 146 is not triangular, for example, even in the case where a cross-sectional shape of the adhering member 146 is circular, the same problem can occur.

In order to solve the above problems, Japanese Unexamined Patent Publication No. 2003-22986 discloses a peeling device in which a baffle plate coated with a special peeling coating is arranged at substantially the same height and adjacent to a support table. In this peeling device, when the peeling head for holding the peeling tape is moved on a support table, a protective film 11 is peeled from a front surface of a wafer.

In this peeling device, during the peeling operation, the relative movement of the peeling head and support table is stopped and then the support table is lowered and the baffle plate is horizontally moved toward an edge portion of the wafer. Due to the foregoing, in the peeling device described in Japanese Unexamined Patent Publication No. 2003-22986, the adhesive face 3a between the mount frame 36 and the wafer 20 is covered with a baffle plate. Therefore, it is possible to prevent the peeling tape 4 from adhering to the adhesive face 3a of the dicing tape 3. By moving the peeling head relative to the support table once more, the peeling operation can be started again.

However, in the case of the peeling device disclosed in Japanese Unexamined Patent Publication No. 2003-22986, the peeling operation is stopped once to arrange the baffle plate. Accordingly, peeling time is increased as a result of the stoppage of the peeling operation.

Further, in addition to the movement relative to the peeling head and the support table, it is necessary to lower the support table and move the baffle plate in horizontally. Therefore, the structure of the peeling device disclosed in Japanese Unexamined Patent Publication No. 2003-22986 is complicated. When the structure is complicated as described above, there tends to be a failure in the operation and an increase in the cost of the peeling device.

The present invention has been accomplished in view of the above circumstances. It is an object of the present invention to provide a surface protection film peeling method by which a surface protection film can be peeled in a short amount of time while the peeling tape is prevented from adhering to the dicing tape. It is another object of the present invention to provide a surface protection film peeling device for executing this method.

SUMMARY OF THE INVENTION

In order to accomplish the above object, the first aspect provides a surface protection film peeling method for peeling a surface protection film adhered to the front surface of a wafer, on the back surface of which a dicing tape is adhered, the wafer is integrated with a mount frame into one body, comprising the steps of: supporting the wafer and the mount frame on a movable table while the surface protection film is being directed upward; covering an adhesive face of the dicing tape, which is exposed between the mount frame and the wafer at one end of the wafer, with a covering means; adhering a peeling tape onto the surface protection film at the end of the wafer; and peeling the surface protection film from the front surface of the wafer by moving the movable table in a direction from the other end of the wafer to one end.

In the first aspect, after the adhesive face, which is exposed from the dicing tape, has been covered with the covering means, the surface protection film can be peeled by a usual peeling operation, in which the peeling tape is adhered and the movable table is moved, while the peeling tape is prevented from adhering to the dicing tape by the covering means. That is, in the first aspect, it is not necessary to stop the movable table during the peeling operation. Accordingly, the surface protection film can be peeled in a short amount of time.

According to the second aspect, as in the first aspect, when the movable table is moved, the covering means is moved integrally with the movable table.

Therefore, according to the second aspect, it is possible to prevent the covering means from coming into contact with the mount frame and the wafer on the movable table during the peeling operation. Not only it is possible to prevent the peeling tape from adhering to an adhesive face exposed from the dicing tape, but it is also possible after the peeling operation.

According to the third aspect, as in the second aspect, when the surface protection film adhered to the wafer is peeled to a predetermined position, the covering means is retracted to a retraction position at which the dicing tape is not covered.

Therefore, according to the third aspect, by retracting the covering means while conducting the peeling operation, the wafer can be immediately transferred to the next step after the peeling operation has completed. In this connection, the predetermined position represents a position at which the peeling tape can not adhere to an adhesive face exposed from the dicing tape.

According to the fourth aspect, a surface protection film peeling device for peeling a surface protection film adhered to a surface of a wafer, on the back surface of which a dicing tape is adhered, the wafer integrated with a mount frame into one body, comprises: a movable table, which can be moved horizontally, to support the wafer and the mount frame while the surface protection film is being directed upward; a covering means for covering an adhesive face of the dicing tape which is exposed between the mount frame and the wafer at one end of the wafer; and an adhering means for adhering a peeling tape to the surface protection film at the end of the wafer, wherein the surface protection film is peeled from the front surface of the wafer by moving the movable table in a direction from the other end of the wafer to one end after the peeling tape has adhered.

Therefore, according to the fourth aspect, after the adhesive face exposed of the dicing tape is covered with the covering means, by the usual peeling operation in which the peeling tape is adhered and the movable table is moved, the surface protection film can be peeled while the peeling tape is prevented from adhering to the dicing tape by the covering means. Therefore, it is not necessary to stop the movable table during the peeling operation. Accordingly, the surface protection film can be peeled in a shorter amount of time. It is also not necessary to lower the movable table, and the peeling device can be made to be simple.

According to the fifth aspect, as in the fourth aspect, the covering means is moved integrated with the movable table when the movable table is moved.

Therefore, according to the fifth aspect, it is possible to prevent the covering means from coming into contact with the mount frame and the wafer on the movable table during the peeling operation. Not only is it is possible to prevent the peeling tape from adhering to an adhesive face exposed to the dicing tape, but it is also possible to right after the peeling operation.

According to the sixth aspect, as in the fifth aspect, when the surface protection film adhered to the wafer is peeled to a predetermined position, the covering means is retracted to a retraction position at which the dicing tape is not covered.

Therefore, according to the sixth aspect, by retracting the covering means while conducting the peeling operation, the wafer can be immediately transferred to the next step after the peeling operation has finished. In this connection, the predetermined position represents a position at which the peeling tape cannot adhere to an adhesive face exposed of the dicing tape.

According to the seventh aspect, as in one of the fourth to the sixth aspect, the covering means includes a tip portion, the cross section of which is tapered, and Therefore, according to the seventh aspect, the tip portion can be easily advanced to the adhesive face between the wafer and the mount frame.

According to the eighth aspect, as in one of the fourth to the seventh aspect, the covering means is inclined downward with respect to the horizontal face, and Therefore, according to the eighth aspect, the tip portion of the covering means can be positioned at a position lower than the top face of the mount frame. Therefore, in the case where the thickness of the wafer, the back surface of which has been ground, is considerably smaller than the thickness of the mount frame, the tip portion of the covering means can be easily lowered to the wafer position.

According to the ninth aspect, as in one of the fourth to the eighth aspect, the width of the covering means is not less than the width of the peeling tape, and Therefore, according to the ninth aspect, the entire width of the peeling tape can be received by the tip portion of the covering means.

According to the tenth aspect, as in one of the fourth to the ninth aspect, a plurality of raised portions extending in the moving direction of the movable table are formed on an upper face of the covering means along the width of the covering means.

Therefore, according to the tenth aspect, when the peeling tape adheres to the tip portion of the covering plate, the peeling tape adheres only to tip portions of a plurality of raised portions. Therefore, it is possible to prevent the peeling tape from completely adhering to the covering means.

According to the eleventh aspect, as in the seventh aspect, a step portion is formed on a lower face of the covering means and the tip portion is located at a position lower than a base portion of the covering means by a distance corresponding to the step portion.

Therefore, according to the eleventh aspect, the tip portion can be positioned at a lower position than the distance corresponding to the height of the step portion.

These and other objects and advantages of the present invention will be more apparent in light of the detailed description of exemplary embodiments thereof as illustrated by the drawings.

BRIEF DESCRIPTION OF THE DRAWINGS

In the drawings:

FIG. 3c is a sectional view taken on line A-A in FIG. 3a;

FIG. 4 is a flow chart showing an operation program of the surface protection film peeling device according to the present invention;

DETAILED DESCRIPTION OF THE PREFERRED EMBODIMENTS

Figure 1:
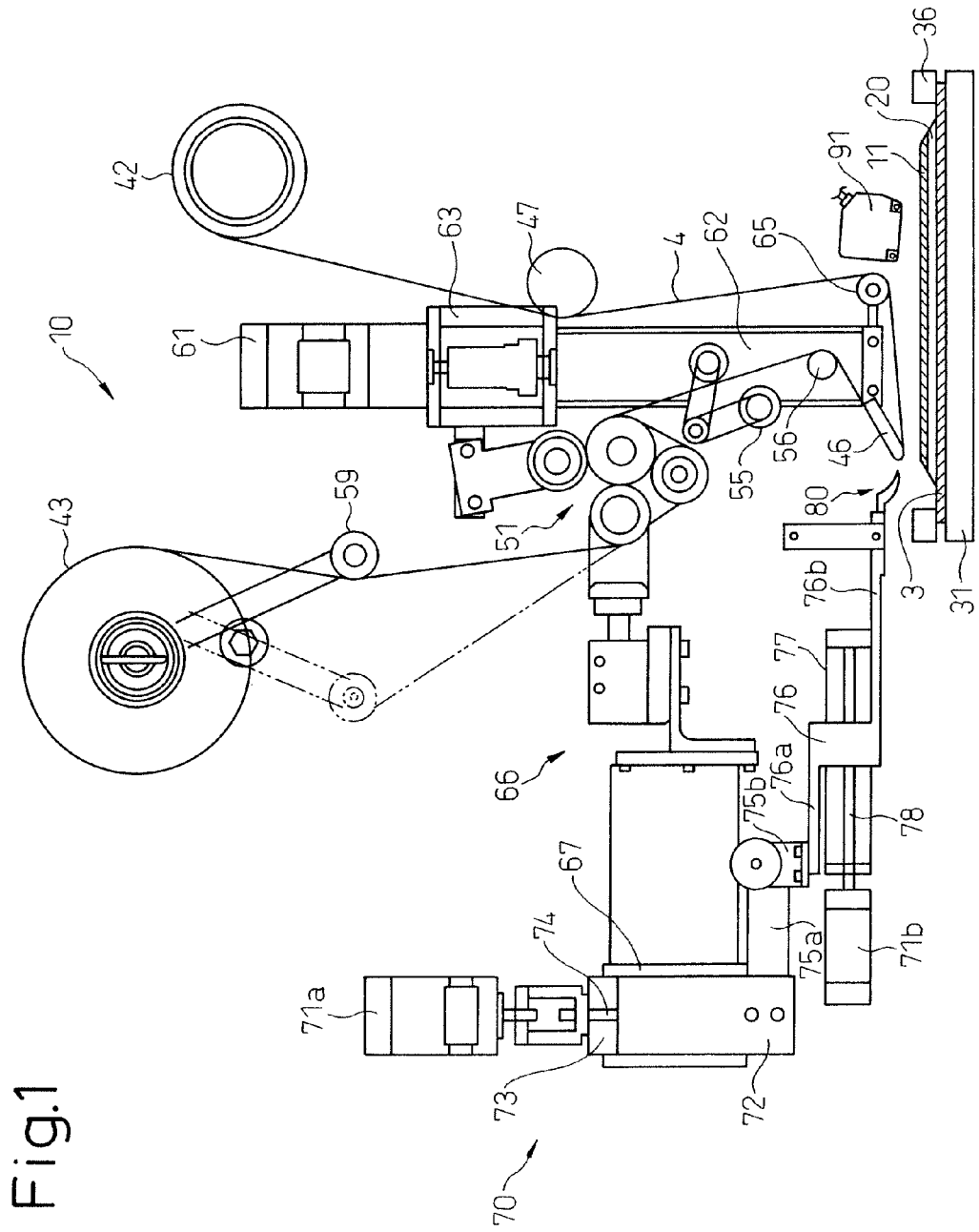
FIG. 1 is a schematic illustration showing a surface protection film peeling device according to the present invention.

Referring to the accompanying drawings, an embodiment of the present invention will be explained below. Like reference numerals are used to indicate like parts in the following drawings. In order to facilitate understanding, the scale of these drawings has been appropriately changed.

Figure 9:
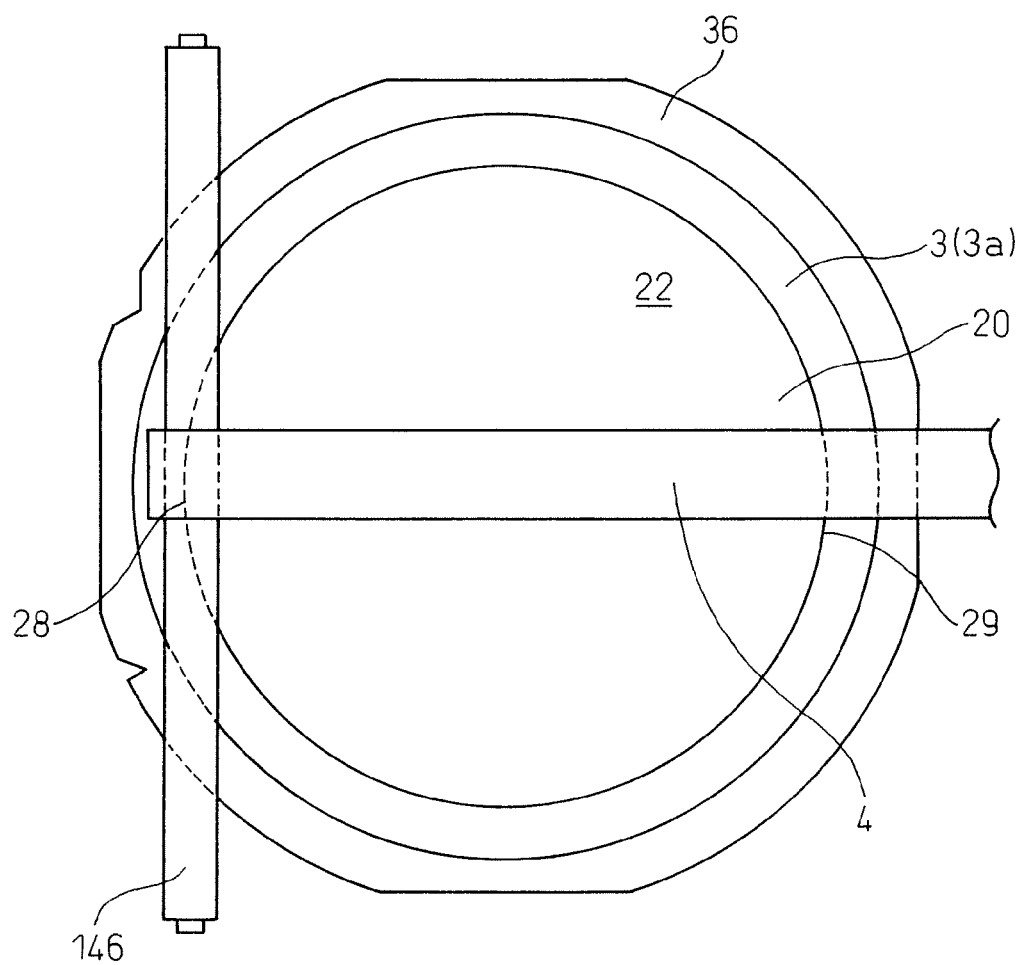
FIG. 9 is a top face view of a wafer integrated with a mount frame.
Figure 10:
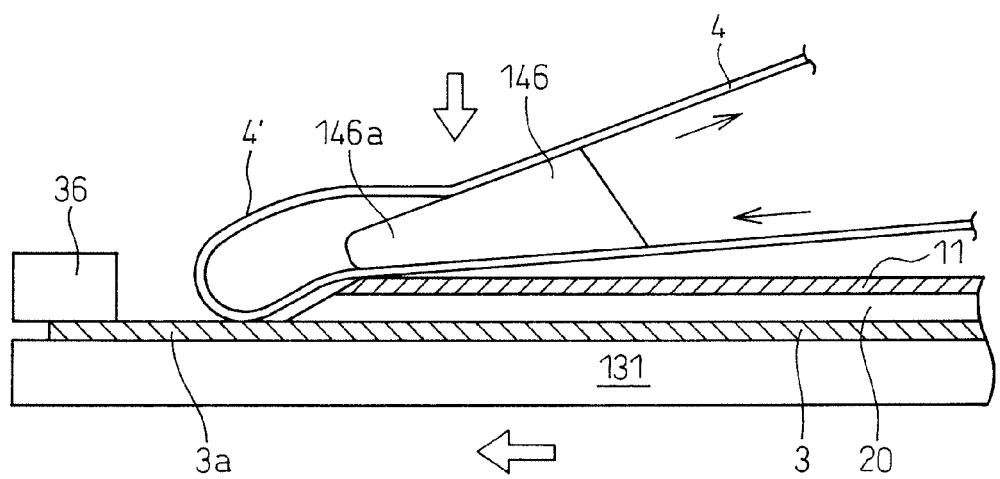
FIG. 10 is a sectional view showing a state in which a peeling tape is adhered to a surface protection tape of a wafer in the prior art.

FIG. 1 is a schematic illustration showing a surface protection film peeling device according to the present invention. The back surface of a wafer 20, which is fed to the surface protection film peeling device 10, is ground up to a chamfered portion 26 on a front surface side by back-grinding. For example, the wafer 20 is not more than 100 micrometers thick. As it is well known, a surface protection film 11 for protecting a circuit pattern has already been adhered to the front surface of the wafer 20. Further, as explained before referring to FIG. 9, a dicing tape 3 is adhered to a grinding surface 22 of the wafer 20. Therefore, the wafer 20 is integrated with a mount frame 36 into one body by the dicing tape 3.

The surface protection film peeling device 10 shown in FIG. 1 includes: a supply portion 42 for supplying a peeling tape 4 that is adhered to the surface protection film 11 on the wafer 20; and a winding portion 43 for winding the peeling tape 4 sent from the supply portion 42. The peeling tape 4, which will be explained below, is a pressure sensitive tape, which exhibits adhesion when pressure is applied to the tape. Alternatively, the peeling tape 4 may be a heat sensitive tape, which adheres when the tape is heated.

As shown in FIG. 1, in the downstream of the supply portion 42, guide rollers 47, 65 are arranged, which guide the peeling tape 4 and give a predetermined tension to the peeling tape 4. The peeling tape 4 passes through a adhering member 46 of the surface protection film peeling device 10 and is guided to the winding portion 43. As shown in the drawing, a cross section of the tip portion of the adhering member 46 is a rectangle or a triangle. This adhering member 46 is positioned in such a manner that the tip portion of the adhering member 46 can contact the wafer 20 in a small area. There are provided a guide roller 56, dancer roller 55, a pair of guide rollers 51 and other dancer rollers 59 between the adhering member 46 and the winding portion 43. These dancer rollers 55, 59 are operated according to an amount of peeling tape 4 that has been drawn out.

The surface protection film peeling device 10 has a shaft 62 inserted into a cover guide portion 63. A motor 61 is attached to an upper portion of the cover guide portion 63. As shown in the drawing, the adhering member 46 is arranged at a bottom end portion of the shaft 62. The guide rollers 56, 65 related to the adhering member 46 are arranged at predetermined positions of the shaft 62. Accordingly, when the shaft 62 is elevated along the cover guide portion 63 by the motor 61, the adhering member 46 and the guide rollers 56, 65 are integrally elevated. In this connection, it is possible to employ an air cylinder for elevating the shaft 62.

Below the adhering member 46, a support table 31 is provided which supports the wafer 20 and the mount frame 36. This support table 31 can be moved horizontally, that is, this support table 31 can be moved in the lateral direction in FIG. 1. A position sensor 91 arranged behind the guide roller 65 detects the position of one end 28 of the wafer 20 and the position of the rear end 39 of the support table 31.

In FIG. 1, a covering plate unit 70 is arranged on the left of the shaft 62. As shown in the drawing, a connection unit 66 extends from the cover guide portion 63. At a forward end of the connection unit 66, a holder 67 is arranged. This holder 67 holds a cover guide portion 73 of the covering plate unit 70. A slider 72 is engaged with a guide rail 74 extending vertically in the cover guide portion 73. To an upper portion of the cover guide portion 73, a motor 71a for sliding the slider 72 is attached.

A bracket 75a extending toward the shaft 62 is screwed to the bottom end portion of the slider 72. Further, at a forward end of the bracket 75a, another bracket 75b is pivotally arranged. In the embodiment shown in FIG. 1, another bracket 75b extends downward from a forward end of the bracket 75a.

As can be seen from FIG. 1, at the forward end of another bracket 75b, an extension portion 76a extending from one side of the slider 76 is screwed. On the other side of the slider 76, another extension portion 76b extends in a direction opposite to the extension portion 76a.

Figure 2:
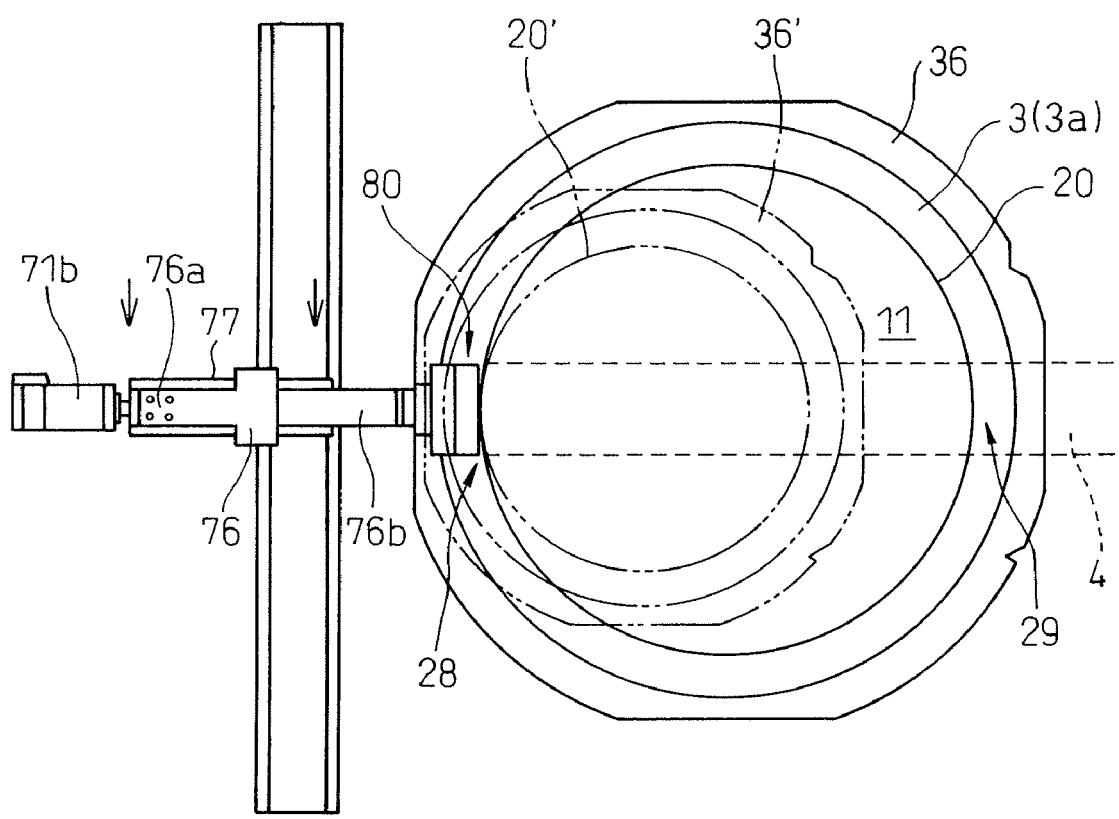
FIG. 2 is a partial enlarged view showing a portion of the surface protection film peeling device shown in FIG. 1.

FIG. 2 is a partial enlarged view showing a portion of the surface protection film peeling device shown in FIG. 1. For the purpose of simplification, the adhering member 46 and other members are omitted in the drawing. As shown in FIGS. 1 and 2, this slider 76 is engaged with a guide rail 78 extending horizontally in the cover guide portion 77. Further, at a proximal end portion of the cover guide portion 77, a motor 71b for sliding the slider 76 is provided.

As shown in FIGS. 1 and 2, at the forward end of the extension portion 76b, a covering plate 80 is attached. The covering plate 80 will be described in detail later. As shown in FIG. 2, the dicing tape 3 is annularly exposed between the mount frame 36 and the wafer 20. This annularly exposed portion will be referred to as an exposed face 3a of the dicing tape 3, hereinafter. In this connection, as can be seen from FIG. 2, the surface protection film peeling device 10 of the present invention can be applied to a wafer 20' and a mount frame 36' having different sizes.

When the slider 72 is slid by the motor 71a shown in FIG. 1 vertically along the guide rail 74 of the cover guide portion 73, the slider 76 and the covering plate 80 are integrally moved vertically. Further, when the slider 76 is slid by the motor 71b horizontally along the guide rail 78 of the cover guide portion 77, the covering plate 80 is also moved horizontally being integrated with the slider 76. When these motors 71a, 71b are driven, the covering plate 80 can be moved to a desired position. In this connection, the sliders 72, 76 may be slid by air cylinders instead of utilizing the motors 71a, 71b.

Figure 3A:
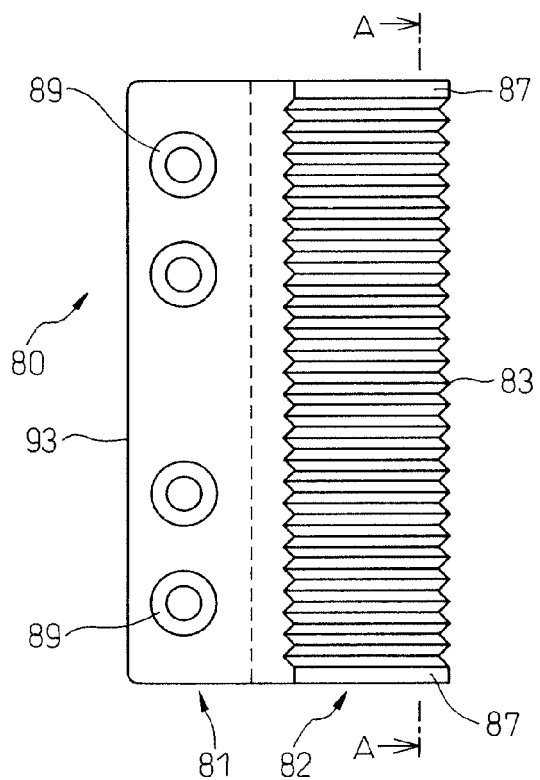
FIG. 3a is a top face view showing a covering plate.
Figure 3B:
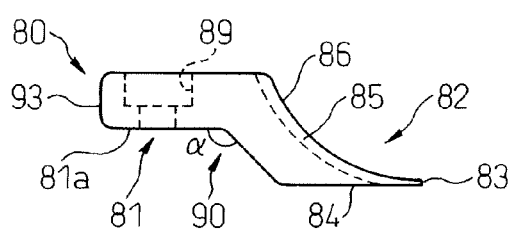
FIG. 3b is a side view showing the covering plate.

FIG. 3a is a top face view showing a covering plate and FIG. 3b is a side view showing the covering plate. The covering plate 80 includes: a base portion 81 in which a plurality of screw holes 89 for fixing the covering plate 80 to the forward end of the extension portion 76b are formed; and a forward end portion 82 extending forward from the base portion 81 in such a manner that it is curved downward, where the slope is concaved.

The distance between both side end portions 87 at the forward end portion 82 of the covering plate 80 is not less than the width of the peeling tape 4. Therefore, the forward end portion 82 of the covering plate 80 can receive the entire width of the peeling tape 4.

As can be seen from FIG. 3b, a cross section of the forward end portion 82 is gradually tapered down toward the edge portion 83. In FIG. 3b, the upper face of the forward end portion 82 is formed into a shape, which substantially corresponds to a portion of a cylinder. However, the cross section of the forward end portion 82 may be formed into another shape, for example, the cross section of the forward end portion 82 may be formed into a triangle. At the edge portion 83 of the forward end portion 82, the thickness is almost zero. At the edge portion 83 of the forward end portion 82, the forward end portion 82 extends in a substantially horizontal direction. The above shape of the forward end portion 82 is suitable for receiving a loop 4a of the peeling tape 4, which is redundantly drawn out from the adhering member 46.

As shown in FIG. 3b, a step portion 90 is formed on a lower face of the covering plate 80. A lower face 84 of the forward end portion 82, which is substantially parallel to a lower face 81a of the base portion 81, is located at a position lower than the lower face 81a. Angle $\alpha$ formed between the lower face 81a of the base portion 81, and the step portion 90, is an obtuse angle. In FIG. 3b, angle $\alpha$ is approximately 120°.

The length of the lower face 84 in the moving direction of the support table 31, which is perpendicular to a line segment connecting both side end portions 87, is shorter than the difference between an inner diameter of the mount frame 36 and an outer diameter of the wafer 20, that is, a little shorter than the width of the annularly exposed face 3a. Therefore, the covering plate 80 can easily cover a portion of the exposed face 3a.

At least a forward end portion 82 of the covering plate 80 is made of a non-adhesive material to which an adhesive agent on the peeling tape 4 is difficult to adhere, for example, the forward end portion 82 of the covering plate 80 is made of Teflon (registered brand) (polytetrafluoroethylene). Alternatively, the forward end portion 82 is coated with a non-adhesive material. Due to the above structure, when the peeling tape 4 comes into contact with the forward end portion 82 of the covering plate 80, the peeling tape 4 can be prevented from adhering to the forward end portion 82.

Figure 3C:
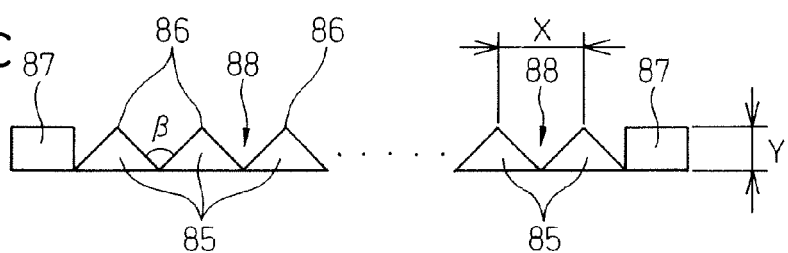

As can be seen from FIG. 3c, which is a view taken along line A-A in FIG. 3a, a plurality of raised portions 85 are formed being adjacent to each other between both side end portions 87 of the forward end portion 82. These raised portions 85 extend parallel to the table moving direction along an upper face of the forward end portion 82. These raised portions 85 are formed by forming a plurality of grooves 88 corresponding to the raised portions 85, on the upper face of the forward end portion 82.

As shown in the drawing, a top portion 86 of each raised portion 85 and a top face of the side end portion 87 are on the same plane. In the case where the forward end portion 82 is composed as described above, the peeling tape 4 comes into contact with only the top portion 86 of each raised portion 85. Accordingly, when the peeling tape 4 adheres to a plurality of top portions 86, the adhesive force of the peeling tape is relatively lower than that in the case where the upper face of the forward end portion 82 is flat. Therefore, when the peeling tape 4 adheres to the forward end portion 82, the peeling tape 4 can be easily peeled away from the forward end portion 82 by adjusting the supply portion 42 and the winding portion 43. That is, in the present invention, when the covering plate having a plurality of raised portions 85 is employed, it is possible to avoid the peeling tape 4 being adhered to the covering plate 80.

In the preferred embodiment as shown in FIG. 3c, the distance X between the top portions 86 adjacent to each other is approximately 2 mm and the height Y (height of the side end portion 87) of the raised portion 85 is approximately 1 mm. Further, angle $\beta$ formed between the raised portions adjacent to each other is 90°. In other words, in FIG. 3c, a cross section of the groove 88 for forming the raised portion 85 is a right angled triangle. The sizes and shapes of the raised portion 85 and the corresponding groove 88 may be changed. The cross section of the groove 88 may be formed into another shape, for example, the cross section of the groove 88 may be formed into a semicircle.

FIG. 4 is a flow chart showing an operation program of the surface protection film peeling device according to the present invention. This operation program is incorporated into a memory of a control portion 95 not shown of the surface protection film peeling device 10 and carried out by the control portion 95.

FIGS. 5a, 5b, 6a and 6b are views showing the operation of the surface protection film peeling device. Referring to these drawings, operation of the surface protection film peeling device of the present invention will be explained below. In this connection, before the surface protection film peeling device 10 is driven, the peeling tape 4 has already been drawn out of the supply portion 42 to the winding portion 43 through the adhering member 46.

In step 101 of the operation program 100 shown in FIG. 4, the wafer 20 and the mount frame 36, which have been integrated with each other into one body by the dicing tape 3, are supported by the support table 31.

Next, in step 101a, a position of the wafer 20 on the support table 31 is detected by the sensor 91. In step 101b, the support table 31 is moved horizontally in such a manner that the adhering member 46 can be located above one end portion 28 of the wafer 20. Alternatively, the support table 31 may be previously positioned before the wafer 20 is supported.

Figure 5A:
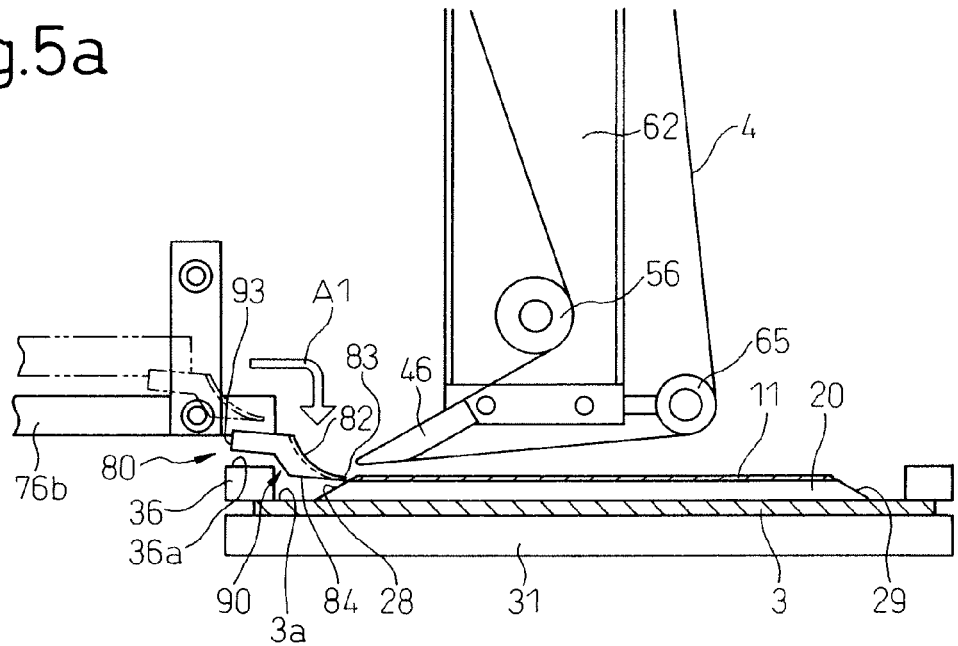
FIG. 5a is a first view showing operation of the surface protection film peeling device.

Next, when the motors 71a, 71b of the covering plate unit 70 are driven, the covering plate 80 is moved downward and forward in straight lines, from its initial position as shown by arrow A1 in FIG. 5a. Due to the foregoing, as shown in FIGS. 2 and 5a, the covering plate 80 is arranged above the exposed face 3a of the dicing tape 3 (step 102). In other words, the exposed face 3a located in the neighborhood of one end 28 of the wafer 20 is covered with the covering plate 80.

In this connection, as shown in FIG. 5a, the covering plate 80 is attached to the extension portion 76b being inclined downward with respect to the horizontal face. Therefore, the edge portion 83 of the forward end portion 82 is located at a position lower than the rear end 93 of the base portion 81. Due to the above structure, it is possible to position the edge portion 83 of the forward end portion 82 at a position lower than the top face 36a of the mount frame 36.

As described before, the back surface 22 of the wafer 20 is ground by back grinding. Therefore, the thickness (for example, not more than 100 micrometers) of the wafer 20 after the completion of grinding is considerably less than the thickness (for example, 1.6 mm) of the mount frame 36. That is, the upper face of the end portion 28 of the wafer is located at a position lower than the top face 36a of the mount frame 36. Therefore, in the case where the covering plate 80 is attached and inclined downward with respect to the horizontal face, the edge portion 83 of the covering plate 80 can be lowered to the boundary portion between the wafer 20 and the surface protection film 11 and positioned in the front of a boundary portion.

As described before referring to FIG. 3b, it is especially advantageous that the covering plate 80 has the step portion 90. As can be seen from FIGS. 3b and 5a, in this case, the lower face 84 of the forward end portion 82 can be positioned at a lower position by a height corresponding to the step portion 90. This matter is clearly advantageous if the difference between the thickness of the wafer 20 after grinding and the thickness of the mount frame 36 is considerably thick.

As described before referring to FIG. 3b, angle α formed between the step portion 90 and the lower face 81a of the base portion 81 is an obtuse angle. For example, it is preferable that angle α be 120°. Usually, the angle formed between the top face 36a and the inner circumferential face of the mount frame 36 is 90°. Therefore, in the case where angle α is an obtuse angle, while the step portion 90 of the covering plate 80 is prevented from coming into contact with the mount frame 36, the edge portion 83 of the covering plate 80 can be easily positioned at a position lower than the top face 36a of the mount frame 36.

Figure 5B:
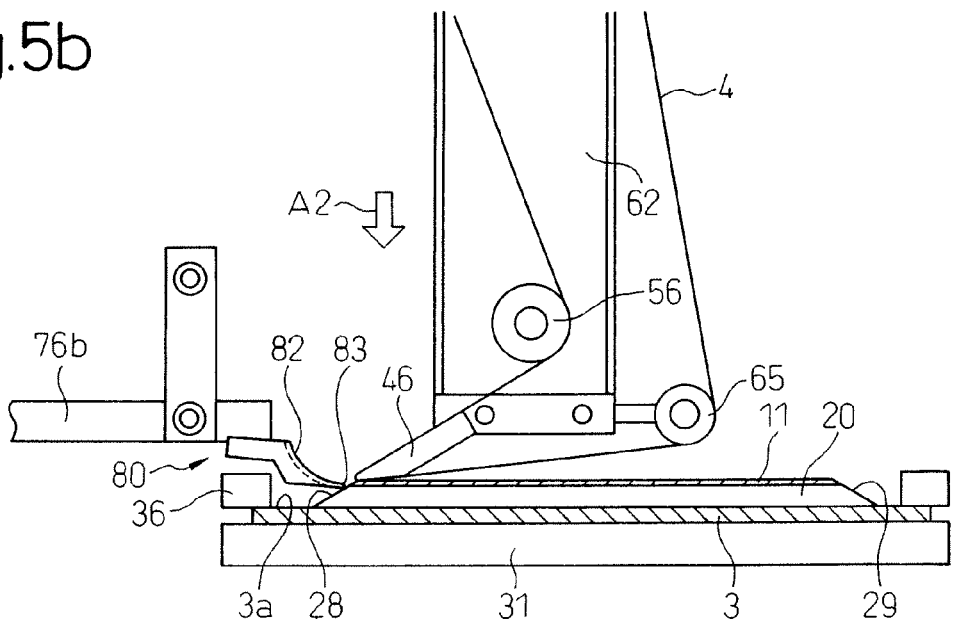
FIG. 5b is a second view showing operation of the surface protection film peeling device.

Next, when the motor 61 shown in FIG. 1 is driven, the shaft 62 is lowered as shown by arrow A2 in FIG. 5b. Due to the foregoing, as shown in FIG. 5b, the adhering member 46, which is arranged in a bottom end portion of the shaft 62, presses the peeling tape 4 onto the surface protection film 11 adhered to the wafer 20. Accordingly, the peeling tape 4 is adhered to the surface protection film 11 located in the neighborhood of one end portion 28 of the wafer 20 (step 103).

Figure 6A:
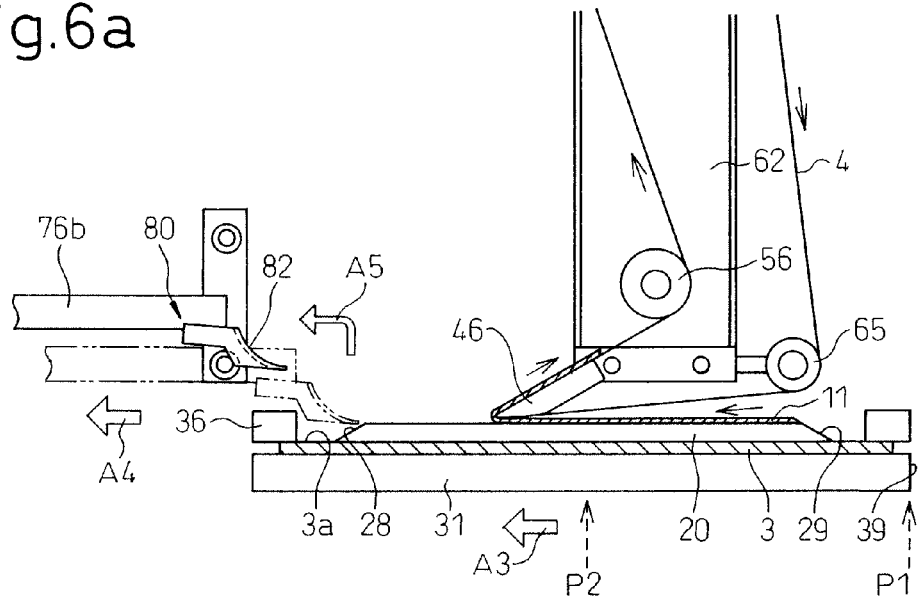
FIG. 6a is a third view showing operation of the surface protection film peeling device.

As shown by arrows A3 and A4 in FIG. 6a, the support table 31 is moved horizontally from the other end 29 to one end 28 of the wafer integrally with the covering plate 80 (step 104). At the same time, the peeling tape 4 is drawn out from the supply portion 42 and the peeling tape 4 is wound up by the winding portion 43. Due to the foregoing, the position, at which the peeling tape 4 has been adhered, functions as a peeling start position, and the surface protection film 11 is gradually peeled away from the peeling start position at one end 28 of the wafer 20.

When the support table 31 is moved as shown by arrows A3 and A4, the motor 71b is driven to move the covering plate 80 integral with the support table 31. In other words, in the present invention, when the support table 31 is moved, the distances between the covering plate 80 and the wafer 20 and between the covering plate 80 and the mount frame 36 are not changed. Due to the foregoing, it is possible to prevent the covering plate 80 from coming into contact with the mount frame 36 and the wafer 20 during the peeling operation.

Figure 7:
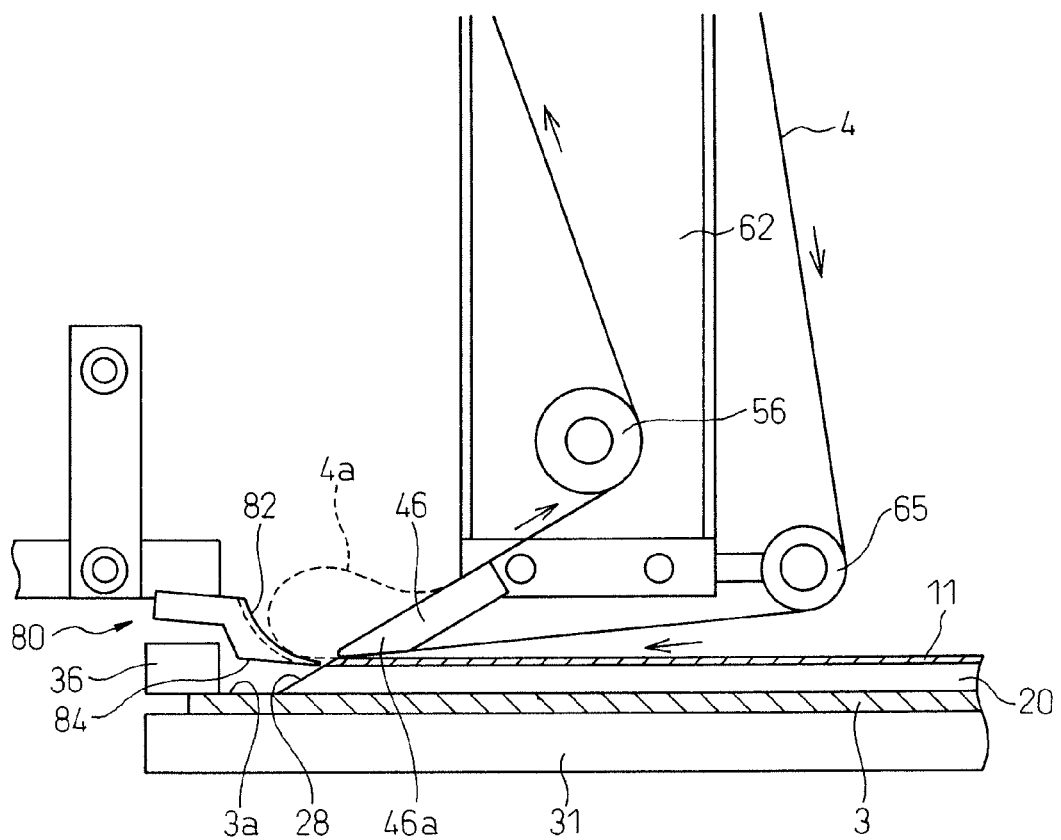
FIG. 7 is a partial enlarged view showing a portion of the surface protection film peeling device.

FIG. 7 is a partial enlarged view showing a portion of the surface protection film peeling device. If the supply portion 42 and the winding portion 43 are driven, as shown in FIG. 7, a loop 4a may be formed when the peeling tape 4 is loosened at the forward end 46a of the adhering member 46 in some cases. Since this loop 4a is received on an upper face of the forward end portion 82 of the covering plate 80 in the present invention, the loop 4a of the peeling tape 4 can be prevented from adhering to the exposed face 3a of the dicing tape 3.

As described before referring to FIG. 3a, a plurality of raised portions 85 are formed in the forward end portion 82 of the covering plate 80. Therefore, when the loop 4a of the peeling tape 4 comes into contact with the forward end portion 82, the loop 4a contacts only the top portion 86 of the raised portion 85. Therefore, the adhesion of the loop 4a to the top portion 86 is considerably weak. Accordingly, when the supply portion 42 and the winding portion 43 are driven, the loop 4a of the peeling tape 4 can be easily separated from the forward end portion 82 of the covering plate 80.

At the time of moving the support table 31, the position sensor 91 shown in FIG. 1 detects the position of the support table 31. When it is determined that the rear end 39 of the support table 31 has moved to a predetermined first position P1 shown in FIG. 6a, the covering plate 80 is retracted in straight lines, as shown by arrow A5 shown in FIG. 6a (steps 105 to 107). In the case where the covering plate 80 is retracted during the peeling operation, the wafer 20 and the mount frame 36 can be removed from the support table 31 after the completion of peeling operation. Therefore, right after the completion of peeling operation, the wafer 20 and the mount frame 36 can be immediately transferred to the next step. However, the retraction of the covering plate 80 may be conducted after the surface protection film 11 has been peeled completely away from the entire surface of the wafer 20.

At first position P1 shown in FIG. 6a, the adhering member 46 is away from one end 28 of the wafer 20 to some degree. Therefore, even when the loop 4a of the peeling tape 4 is formed, this loop 4a does not reach the exposed face 3a. In other words, the first position P1 is a position at which the loop 4a of the peeling tape 4 can not reach the exposed face 3a.

Figure 8:
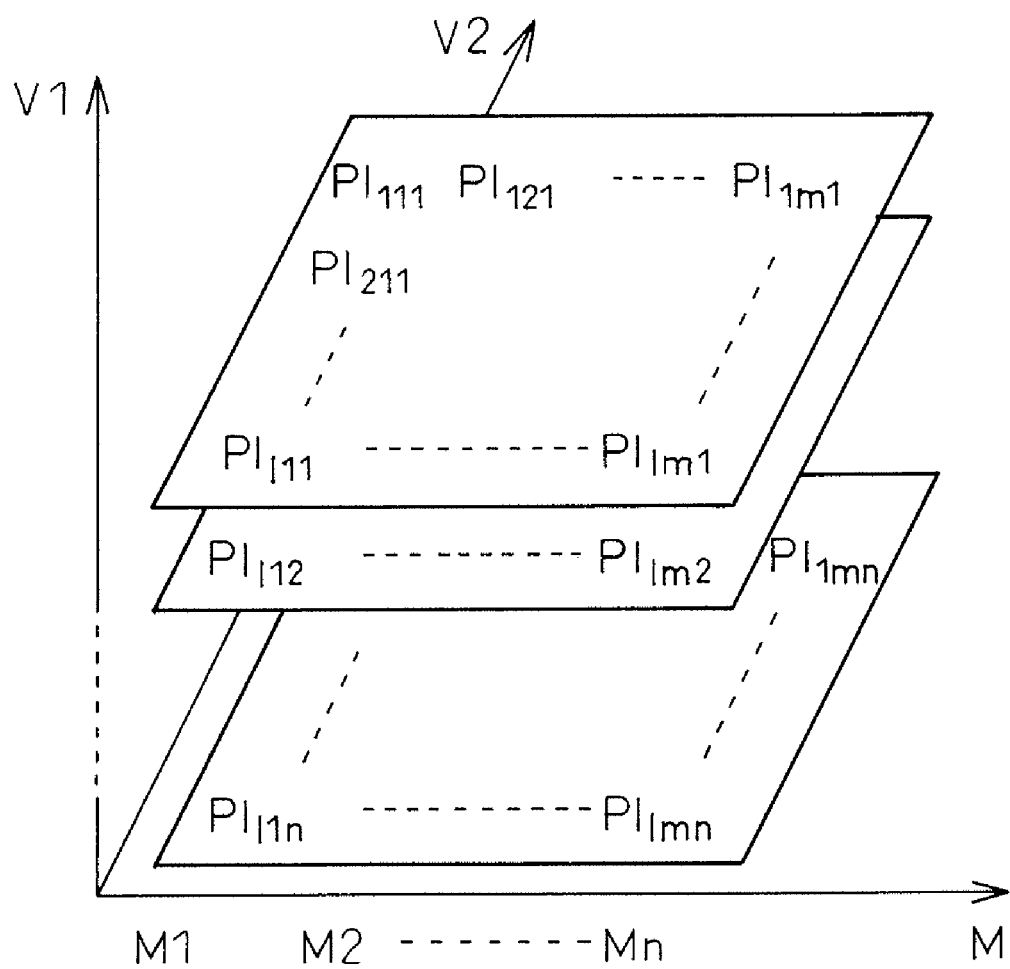
FIG. 8 is a view showing a map of first position P1.

In this connection, the size of the loop 4a to be formed changes according to the drawing speed V1 of the peeling tape 4, moving speed V2 of the support table 31 and material M of the peeling tape 4. Accordingly, as shown in FIG. 8, the first position P1 is previously incorporated into the memory of the control portion 95 as a function of drawing speed V1 of the peeling tape 4, moving speed V2 of the support table 31 and material M of the peeling tape 4. In other words, before the surface protection film peeling device 10 is driven, the first position P1 is previously set using a map.

Figure 6B:
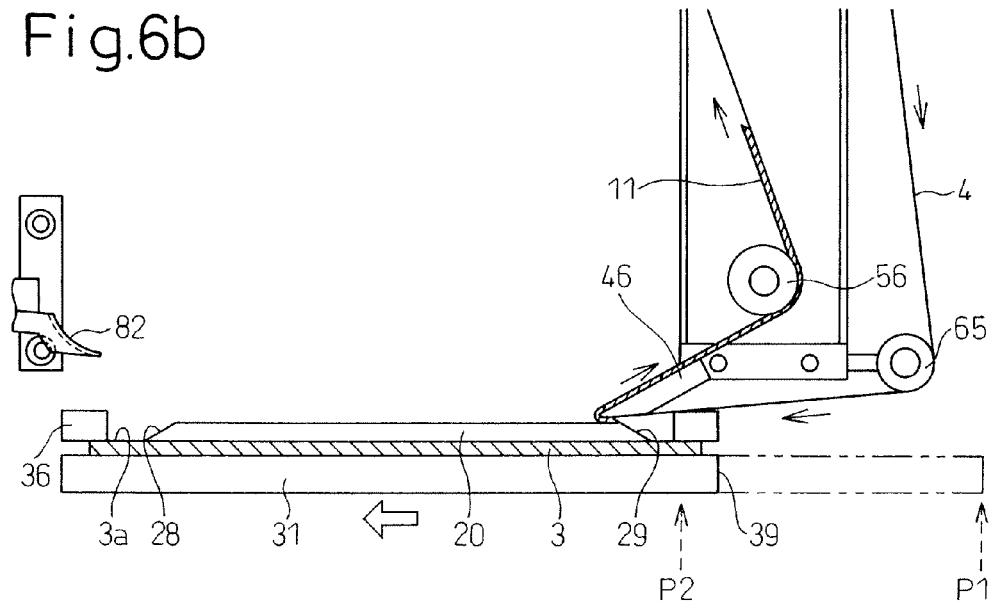
FIG. 6b is a fourth view showing operation of the surface protection film peeling device.

Next, when a rear end 39 of the support table 31 is moved to a predetermined second position P2 shown in FIGS. 6a and 6b, it is determined that the surface protection film 11 has been perfectly peeled off from an overall face of the wafer 20. Accordingly, when it is detected that rear end 39 of the support table 31 has moved to second position P2, the peeling tape 4 and the support table 31 are stopped. In this way, the peeling operation of the surface protection film peeling device 10 is complete (steps 108 to 110).

As described above, in the surface protection film peeling device 10 of the present invention, the operation is usually conducted as follows. After the covering plate 80 has covered the exposed face 3a, the peeling tape 4 is adhered and the support table 31 is moved. Due to this usual operation, while the peeling tape 4 is prevented from adhering to the exposed face 3a of the peeling tape 4, the surface protection film 11 can be peeled off.

In the present invention, it is not necessary for the table to be stopped during the peeling operation in order to arrange the baffle plate, and it is not necessary for the table to be lowered which is unlike the prior art. Therefore, compared with the prior art, the surface protection film 11 can be peeled off in a shorter period of time than in the present invention. Further, in the present invention, it is not necessary to lower the table. Therefore, the entire structure of the surface protection film peeling device 10 can be simplified. As a result, it is possible to reduce the manufacturing cost of the surface protection film peeling device 10.

In the embodiment explained above referring to the drawings, the back surface of the wafer 20 is ground and the thickness of the wafer 20 is reduced. However, in the case where the surface protection film 11, which is adhered to the wafer, the back surface of which is not ground, is peeled off, the surface protection film peeling device 10 of the present invention can be applied.

Figure 11A:
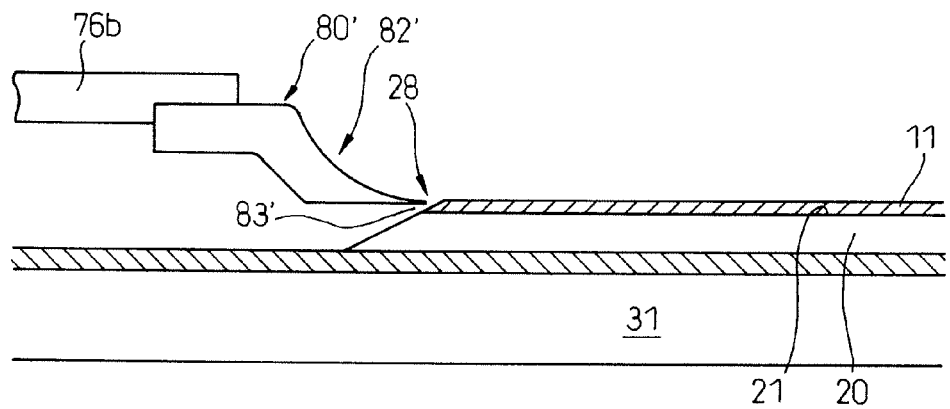
FIG. 11a is a partly enlarged view showing the incision forming operation of the surface protective film peeling device according to another embodiment of this invention.
Figure 11B:
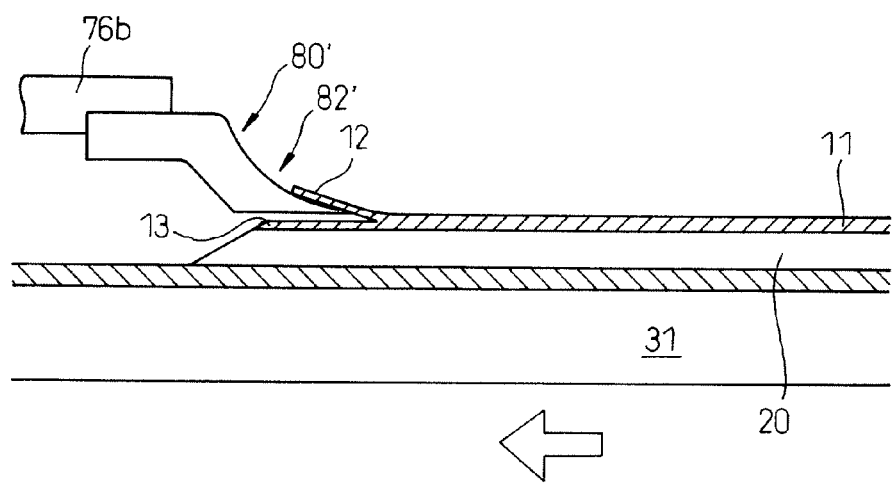
FIG. 11b is another partly enlarged view showing the incision forming operation of the surface protective film peeling device according to another embodiment of this invention.

FIGS. 11*a* and 11*b* are partially enlarged view showing the incision forming operation of the surface protective film peeling device according to another embodiment of the present invention. The raised portions 85 and the side end portions 87 are not formed in a forward end portion 82' of a covering plate 80' in another embodiment. Thus, an edge portion 83' of the forward end portion 82' is sharply formed as a knife.

In FIG. 11*a*, an edge portion 83' of a forward end portion 82' comes to be located to face the edge portion 28 of the surface protective film 11 attached on the front surface of the wafer 20. More preferably, the edge portion 83' of the forward end portion 82' is arranged between the boundary between the surface protective film 11 and the front surface 21 of the wafer 20 on the one hand and the point half along the thickness of the surface protective film 11 on the other hand. As an alternative, the edge portion 83' of the forward end portion 82' may be arranged at a position corresponding to the sticking layer (not shown) of the surface protective film 11.

Next, as shown in FIG. 11*b*, the movable table 31 is moved by a predetermined minuscule distance further toward the covering plate unit 70. This minuscule distance is 1 mm, for example, i.e. a so short a distance that the edge portion 83' of the forward end portion 82' does not reach the circuit pattern (not shown) formed on the front surface 21 of the wafer 20. With the movement of the movable table 31 by a minuscule distance, the edge portion 83' of the forward end portion 82' advances into the thickness of the surface protective film 11, so that the surface protective film 11 is partially cut along the front surface thereof. As a result, the edge portion 28 of the surface protective film 11 is divided into a lower piece 13 left attached on the wafer 20 and an upper piece 12 riding over the forward end portion 82'. After that, the movable table 31 is moved in the opposite direction and the forward end portion 82' is retreated. Then, the upper piece 12 is returned substantially to the original position by the elasticity thereof, and a incision 15 is formed between the upper piece 12 and the lower piece 13 (see FIG. 12).

After the incision 15 is formed, the movable table 31 is returned to a position under the peeling member 46. As a result, the edge portion 28 of the surface protective film 11 corresponding to the upper piece 12 comes to be located under the forward end of the peeling member 46.

Figure 12A:
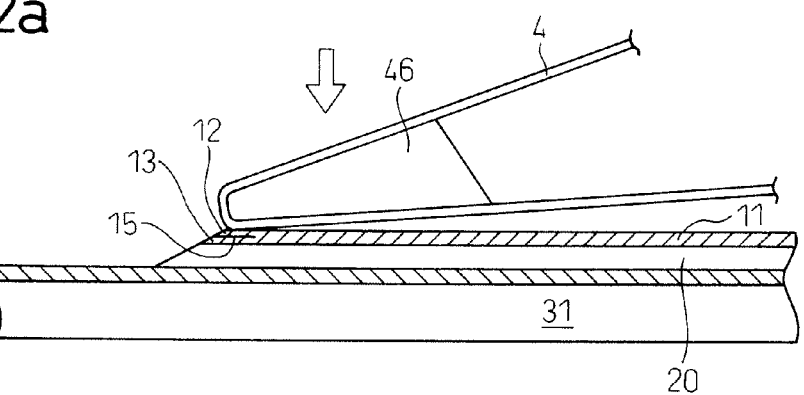
FIG. 12a is a partly enlarged view showing the peeling operation of the surface protective film peeling device according to another embodiment of this invention.
Figure 12B:
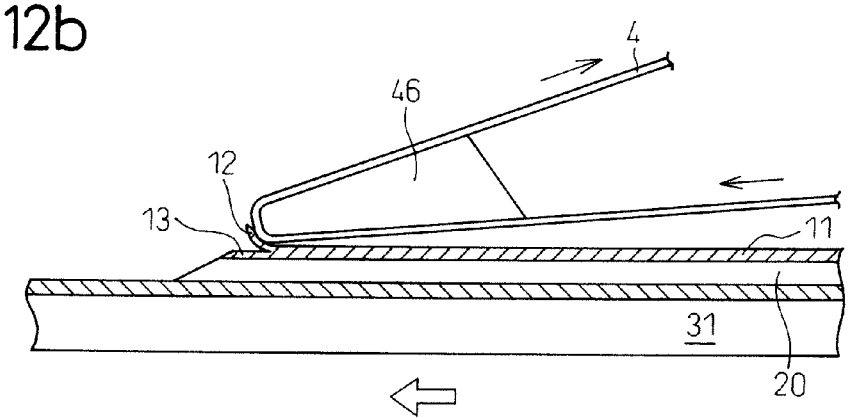
FIG. 12b is a partly enlarged view showing the peeling operation of the surface protective film peeling device according to another embodiment of this invention.
Figure 12C:
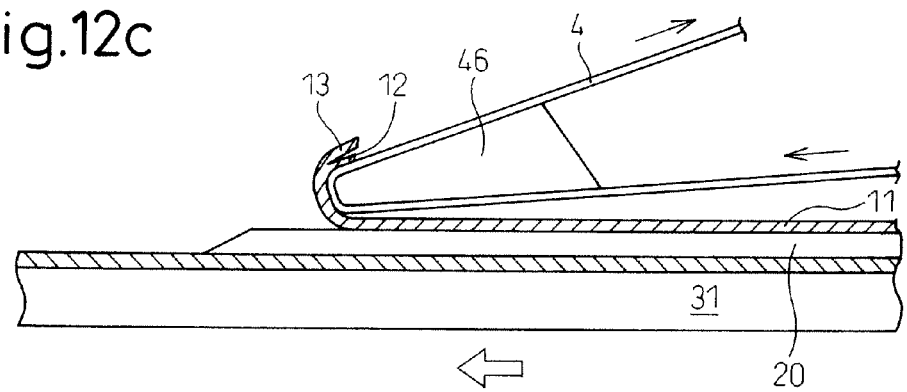
FIG. 12c is a partly enlarged view showing the peeling operation of the surface protective film peeling device according to another embodiment of this invention.

FIGS. 12*a* to 12*c* are partly enlarged views showing the peeling operation of the surface protective film peeling device according to another embodiment of the invention. By driving the motor 61, the shaft 62 of the surface protective film peeling apparatus 10 is moved down until the forward end of the peeling member 46 reaches the edge portion 28 of the surface protective film 11, as shown in FIG. 12*a*. The distance by which the shaft 62 moves downward is determined based on the thickness of the wafer 20, the dicing tape 3, the surface protective film 11 and the peeling tape 4. Even in the case where the degree of back grinding of the wafer 20 and/or the thickness of the surface protective film 11 varies from one wafer 20 or lot to another, therefore, the peeling member 46 of the shaft 62 can be accurately moved down.

As can be seen from FIG. 12*a*, the peeling member 46 is moved down in such a manner as to press the surface of the upper piece 12 of the surface protective film 11, namely a portion in which the incision 15 is formed. As a result, the peeling tape 4 wound on the peeling member 46 is attached on the upper piece 12. According to this embodiment, the peeling tape 4 is pressed against the peeling member 46 in such a manner as to adhere only the upper piece 12, and therefore, the required pressure force of the peeling member 46 may be comparatively small. Thus, no cuts, cracks or internal strains are caused in the wafer 20. Further, the peeling member 46 is required to come into contact only with the upper piece 12, and therefore, the peeling tape 4 is prevented from being attached on the dicing tape 3.

Next, as shown in FIG. 12*b*, the movable table 31 is moved slightly toward the covering plate unit 70, i.e. along the diameter toward the edge portion 28 from the other edge portion 29 of the wafer 20. This distance may be about equal to, for example, the minuscule distance described above. Thus, the peeling tape 4 of the peeling member 46 is moved in relation to the motion of the movable table 31, so that the upper piece 12 of the surface protective film 11 is pulled in accordance with the movement of the peeling tape 4. Since the upper piece 12 is pulled, the lower piece 13 is also pulled from the root, i.e. the deepest portion of the incision 15 and peeled off from the wafer 20.

Upon further movement of the movable table 31 toward the covering plate unit 70 as shown in FIG. 12*c*, the lower piece 13 is completely peeled off from the wafer 20. Still further movement of the movable table 31 successively peels off the surface protective film 11 adjacent to the lower piece 13. In the case where the movable table 31 is moved until the edge portion 29 on the other side of the wafer 20 passes through the peeling member 46, the surface protective film 11 can be completely peeled off from the wafer 20. In this way, according to this embodiment, a part of the surface protective film 11 in which the incision 15 is formed, functions as a peeling starting point, and therefore, the surface protective film 11 can be easily peeled off.

Although the invention has been shown and described with exemplary embodiment thereof, it should be understood by those skilled in the art that the foregoing and various other changes, omissions and additions may be made therein and thereto without departing from the scope of the invention.

The invention claimed is:

1. A surface protection film peeling device for peeling a surface protection film adhered to a front surface of a wafer, a dicing tape being adhered on a back surface of the wafer opposite to the front surface, the wafer being integrated with a mount frame into one body, comprising:

a movable table configured to move horizontally to support the wafer and the mount frame while the surface protection film is being directed upward;

a covering means for covering an adhesive face of the dicing tape, the dicing tape being exposed between the mount frame and the wafer at one end of the wafer, wherein an upper face of the covering means has a concaved slope;

a moving means for moving the covering means and positioning the edge portion of the covering means below a top face of the mount frame in front of a boundary portion between the wafer and the surface protection film; and an adhering means for adhering a peeling tape to the surface protection film at the one end of the wafer, wherein the surface protection film is peeled away from the front surface of the wafer by moving the movable table in a direction towards the one end of the wafer, after the peeling tape has been adhered, and wherein a plurality of raised portions including a plurality of adjacent grooves extending in the movement direction of the movable table are formed on the concaved slope of the covering means from a distal end to a proximal end of the concaved slope along a width of the covering means.

2. A surface protection film peeling device according to claim 1, wherein the covering means is configured to move integrally with the movable table when the movable table moves.

3. A surface protection film peeling device according to claim 2, wherein when the surface protection film adhered to the wafer is peeled to a predetermined position, the covering means is retracted to a retraction position at which the dicing tape is not covered.

4. A surface protection film peeling device according to claim 1, wherein an edge portion of the covering means includes a tapered cross section.

5. A surface protection film peeling device according to claim 4, wherein a step portion is formed on a lower face of the covering means and the edge portion is located at a position lower than a base portion of the covering means by a distance corresponding to the step portion.

6. A surface protection film peeling device according to claim 1, wherein a width of the covering means is not less than a width of the peeling tape.

* * * * *